(12) United States Patent
Chilese et al.

(10) Patent No.: US 12,044,313 B2
(45) Date of Patent: Jul. 23, 2024

(54) DUAL VACUUM SEAL

(71) Applicant: KLA Corporation, Milpitas, CA (US)

(72) Inventors: Francis Chilese, San Ramon, CA (US); Shannon Hill, Hayward, CA (US)

(73) Assignee: KLA Corporation, Milpitas, CA (US)

( * ) Notice: Subject to any disclaimer, the term of this patent is extended or adjusted under 35 U.S.C. 154(b) by 251 days.

(21) Appl. No.: 17/567,071

(22) Filed: Dec. 31, 2021

(65) Prior Publication Data
US 2022/0260156 A1 Aug. 18, 2022

Related U.S. Application Data

(60) Provisional application No. 63/148,625, filed on Feb. 12, 2021.

(51) Int. Cl.
*B08B 9/08* (2006.01)
*F16J 15/32* (2016.01)
(Continued)

(52) U.S. Cl.
CPC ............... *F16J 15/32* (2013.01); *B08B 9/08* (2013.01); *B08B 2209/08* (2013.01);
(Continued)

(58) Field of Classification Search
CPC ........ F16J 15/32; B08B 9/08; B08B 2209/08; G03F 7/70591; G03F 7/70883; H01L 21/67017
See application file for complete search history.

(56) References Cited

U.S. PATENT DOCUMENTS 5,207,573 A * 5/1993 Miyagi .................... C21D 1/34
432/152
7,033,142 B2 * 4/2006 Conrad ................... F04D 25/00
417/205
(Continued)

FOREIGN PATENT DOCUMENTS

JP H09263944 A 10/1997
JP 2004099924 A 4/2004
(Continued)

OTHER PUBLICATIONS

PCT/US2022/015540, International Search Report, May 24, 2022.
PCT/US2022/015540, Written Opinion of the International Searching Authority, May 24, 2022.

*Primary Examiner* — Jessica Cahill
(74) *Attorney, Agent, or Firm* — Huse IP Law

(57) ABSTRACT

A vacuum system includes a wall of a vacuum chamber, a flange of the vacuum chamber, an outer seal disposed between the wall and the flange, and an inner seal disposed between the wall and the flange. The outer seal includes a first material; the inner seal includes a second material distinct from the first material. The inner seal is closer to the interior of the vacuum chamber than the outer seal and is separated from the outer seal by a gap. The outer seal may be capable of providing tighter vacuum sealing between the wall and the flange than the inner seal. The inner seal may be more resistant than the outer seal to a gas to be used to clean the interior of the vacuum chamber. The vacuum system also includes a path to couple the gap to a first vacuum pump, to evacuate the gap.

25 Claims, 4 Drawing Sheets

(51) Int. Cl.
*H01L 21/67* (2006.01)
*G03F 7/00* (2006.01)

(52) U.S. Cl.
CPC ...... *G03F 7/70591* (2013.01); *G03F 7/70883* (2013.01); *H01L 21/67017* (2013.01)

(56) References Cited

U.S. PATENT DOCUMENTS

| | | | |
|---|---|---|---|
| 8,021,488 B2* | 9/2011 | Tanaka | C23C 16/4409 118/733 |
| 8,740,588 B2* | 6/2014 | Stones | F04D 19/046 417/244 |
| 2003/0181123 A1* | 9/2003 | Lee | B32B 37/10 445/25 |
| 2008/0088097 A1 | 4/2008 | Tanaka | |
| 2008/0193303 A1* | 8/2008 | Stones | F04D 19/046 417/251 |

FOREIGN PATENT DOCUMENTS

| | | | |
|---|---|---|---|
| JP | 2011044330 A | * | 3/2011 |
| JP | 2012007241 A | | 1/2012 |
| JP | 2015074796 A | | 4/2015 |

* cited by examiner

DUAL VACUUM SEAL

RELATED APPLICATION

This application claims priority to U.S. Provisional Patent Application No. 63/148,625, filed on Feb. 12, 2021, which is incorporated by reference in its entirety for all purposes.

TECHNICAL FIELD

This disclosure relates to vacuum systems, and more specifically to vacuum seals.

BACKGROUND

In some vacuum systems, vacuum sealing is established between a flange (e.g., a door) and a wall of the vacuum chamber by placing O-rings made from identical material into inner and outer grooves for the flange. Each of the O-rings may be referred to as a seal. The O-rings are separated by a gap, which is evacuated to reduce pressure on the inner O-ring.

The O-rings should provide low leakage and permeation to allow the vacuum chamber to maintain a high vacuum. But the O-rings should also be stable, such that they are resistant to a gas used to clean the interior of the vacuum chamber, for example. A lack of resistance to the gas can cause the inner O-ring to degrade due to exposure to the gas, resulting in a leak and in emission of particles from the inner O-ring into the vacuum chamber. These requirements can conflict.

SUMMARY

In some embodiments, a vacuum system includes a wall of a vacuum chamber, a flange of the vacuum chamber, an outer seal disposed between the wall and the flange, and an inner seal disposed between the wall and the flange. The outer seal includes a first material and the inner seal includes a second material that is distinct from the first material. The inner seal is closer to the interior of the vacuum chamber than the outer seal. The outer seal is separated from the inner seal by a gap. The outer seal is capable of providing tighter vacuum sealing between the wall and the flange than the inner seal. The vacuum system also includes a path to couple the gap to a first vacuum pump, to evacuate the gap.

In some embodiments, a method includes disposing an outer seal and an inner seal between a wall of a vacuum chamber and a flange of the vacuum chamber. The outer seal includes a first material and the inner seal includes a second material that is distinct from the first material. The inner seal is closer to the interior of the vacuum chamber than the outer seal. The outer seal is separated from the inner seal by a gap. The outer seal is capable of providing tighter vacuum sealing between the wall and the flange than the inner seal. The method also includes evacuating the gap using a first vacuum pump and, while evacuating the gap using the first vacuum pump, evacuating the interior of the vacuum chamber using a second vacuum pump.

In some embodiments, a vacuum system includes a wall of a vacuum chamber, a flange of the vacuum chamber, an outer seal disposed between the wall and the flange, and an inner seal disposed between the wall and the flange. The outer seal includes a first material and the inner seal includes a second material that is distinct from the first material. The inner seal is closer to the interior of the vacuum chamber than the outer seal. The outer seal is separated from the inner seal by a gap. The inner seal is more resistant than the outer seal to a gas to be used to clean the interior of the vacuum chamber. The vacuum system also includes a path to couple the gap to a first vacuum pump, to evacuate the gap.

BRIEF DESCRIPTION OF THE DRAWINGS

For a better understanding of the various described implementations, reference should be made to the Detailed Description below, in conjunction with the following drawings.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
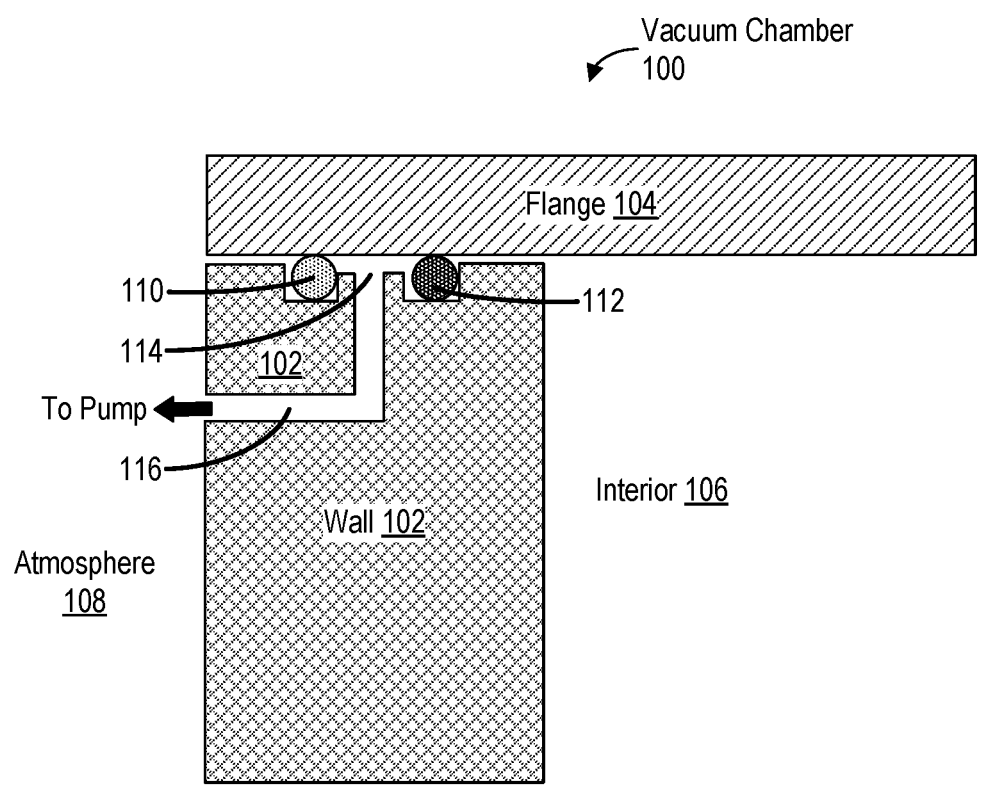
FIG. 1 is a cross-sectional view of a portion of a vacuum chamber in accordance with some embodiments.

FIG. 1 is a cross-sectional view of a portion of a vacuum chamber 100 in accordance with some embodiments. The vacuum chamber 100 includes a wall 102 and a flange 104. (Only a portion of the wall 102 and flange 104 are shown in FIG. 1 for simplicity.) The term flange as used herein refers to a cover for an opening in the vacuum chamber 100. For example, the flange 104 may be a door that opens and closes to allow materials to be placed in and removed from the vacuum chamber 100. In another example, the flange 104 is fixedly attached to the wall 102 but may be removed to perform maintenance on the vacuum chamber 100. The wall 102, flange 104, and/or other components of the vacuum chamber 100 (e.g., including other walls and/or flanges) enclose an interior 106 of the vacuum chamber 100. A vacuum (e.g., an ultra-high vacuum (UHV)) is maintained in the vacuum chamber 100. (UHV is a standard, well-known technical term that refers to vacuums with pressure on the order of $10^{-9}$ torr or lower.) The exterior of the vacuum chamber 100 may be at atmosphere 108 (i.e., at atmospheric pressure).

A portion of the flange 104 is adjacent to the wall 102, as shown for example in FIG. 1. To provide vacuum sealing, an outer seal 110 and an inner seal 112 (e.g., an outer gasket and an inner gasket) are disposed between the wall 102 and the flange 104 (i.e., between the wall 102 and the portion of the flange 104 that is adjacent to the wall 102). In some embodiments, the outer seal 110 and/or inner seal 112 are disposed in respective grooves in the surface of the wall 102 adjacent to the flange 104, as shown in FIG. 1. In other embodiments, the outer seal 110 and/or inner seal 112 are disposed in respective grooves in the surface of the flange 104 adjacent to the wall 102. In still other embodiments, the outer seal 110 and/or inner seal 112 are disposed in respective pairs of grooves in the wall 102 and flange 104, such that both the wall 102 and the flange 104 have grooves to seat the outer seal 110 and/or the inner seal 112. At least one of the wall 102 and the flange 104 thus may have a first groove to seat the outer seal 110 and a second groove to seat the inner seal 112. The inner seal 112 is closer to the interior 106 of the vacuum chamber 100 than the outer seal 110. For example, the outer seal 110 and inner seal 112 as disposed between the wall 102 and the flange 104 (e.g., as disposed in their respective grooves) are concentric, with the outer seal 110 having a larger equivalent diameter (i.e., total length) than the inner seal 112. The outer seal 110 and the inner seal 112 as disposed between the wall 102 and the flange 104 are compressed.

The outer seal 110 and inner seal 112 are separated from each other by a gap 114. The gap 114 is situated between the flange 104 and the wall 102 as well as between the inner seal 112 and the outer seal 110. A path 116 leading from the gap 114 allows the gap 114 to be coupled to a first vacuum pump, to evacuate the gap 114 (and the path 116). The path 116 may pass through the wall 102 (e.g., as shown in FIG. 1) or through the flange 104. In some embodiments, the vacuum achieved in the gap 114 has a higher pressure than (i.e., is a lower vacuum than) the vacuum achieved in the interior 106 of the vacuum chamber 100. For example, the vacuum achieved in the gap 114 is a rough vacuum (i.e., a vacuum with a pressure of $10^{-3}$ torr or above), whereas the pressure for the vacuum in the interior 106 is lower than $10^{-3}$ torr (e.g., is UHV). Evacuating the gap 114 reduces the pressure on the inner seal 112 by reducing the pressure differential between the gap 114 and the interior 106 of the vacuum chamber 100.

The outer seal 110 is capable of providing tighter vacuum sealing (i.e., better sealing, with lower leakage through the seal) between the wall 102 and the flange 104 than the inner seal 112. The outer seal 110 includes (e.g., is made of) a first material. The inner seal 112 includes (e.g., is made of) a second material that is distinct from the first material. In some embodiments, the inner seal 112 is stiffer than the outer seal 110, because the second material is stiffer than the first material. The fact that the outer seal 110 is less stiff than the inner seal 112 allows the outer seal 110 to form a tighter fit with the wall 102 and flange 104 than the inner seal 112, and therefore to provide tighter vacuum sealing between the wall 102 and flange 104 than the inner seal 112.

In some embodiments, the outer seal 110 and the inner seal 112 are both elastomeric seals (e.g., O-rings), with the first material and the second material being respective elastomers. The inner seal 112 thus may be an inner elastomeric seal (e.g., an inner O-ring) and the outer seal 110 may be an outer elastomeric seal (e.g., an outer O-ring). The second material (i.e., the elastomer of the inner seal 112) may be stiffer than the first material (i.e., the elastomer of the outer seal 110). For example, the first material may be a fluoroelastomer (i.e., FKM/FPM) (e.g., as sold under the trademark VITON™) and the second material may be a perfluoroelastomer (i.e., FFKM) (e.g., as sold under the trademark PERFREZ®). Perfluoroelastomer is stiffer than fluoroelastomer, while a fluoroelastomer seal provides tighter vacuum sealing than a perfluoroelastomer seal.

From time to time (e.g., periodically), the interior 106 of the vacuum chamber 100 may be cleaned by introducing a gas into the interior 106. In some embodiments, the gas is (or includes) a reducing gas. For example, the gas is (or includes) ozone or atomic oxygen. During this cleaning process, the interior 106 of the vacuum chamber 100 has a high partial pressure for the gas and thus does not have the vacuum that is maintained in the interior 106 during operation of the vacuum chamber 100. After the cleaning process is complete, the interior 106 is pumped back down to the vacuum level used during operation (e.g., to UHV) and operation of the vacuum chamber 100 resumes.

The inner seal 112 may be more resistant to the gas (e.g., ozone or atomic oxygen) used to clean the interior 106 of the vacuum chamber 100 than the outer seal 110 (i.e., more resistant to chemical and/or physical changes caused by contact with the gas). This increased resistance results, for example, from the inner seal 112 being stiffer than the outer seal 110. In some embodiments, the inner seal 112 is an elastomeric seal (e.g., O-ring) that is more resistant to the gas than the outer seal 110, which is also an elastomeric seal (e.g., O-ring). For example, the inner seal 112 is a perfluoroelastomer while the outer seal 110 is a fluoroelastomer; perfluoroelastomers are more resistant to gases used for vacuum-chamber cleaning than fluoroelastomers. The higher resistance to the gas of the inner seal 112 reduces degradation of the inner seal 112 due to exposure to the gas, thereby reducing leakage through the inner seal 112 and emission of particles from the inner seal 112 into the interior 106 of the vacuum chamber 100 caused by degradation of the inner seal 112. Such particles can contaminate the interior 106 (e.g., components disposed in the interior 106, for example, optics). The higher resistance to the gas of the inner seal 112 thus reduces contamination in the interior 106 of the vacuum chamber (e.g., contamination of the components disposed in the interior 106).

In some embodiments, the outer seal 110 and the inner seal 112 operate under static conditions, with the position of the flange 104 statically fixed with respect to the wall 102 during operation of the vacuum chamber 100. Alternatively, the outer seal 110 and the inner seal 112 may operate under dynamic conditions, such that the flange 104 can move with respect to the wall 102 during operation of the vacuum chamber 100. For example, the flange 104 moves with respect to the wall 102 for self-alignment, to maintain its alignment with the vacuum chamber 100. The outer seal 110 and the inner seal 112 can accommodate the movement of the flange 104 with respect to the wall 102 while collectively maintaining vacuum sealing between the wall 102 and the flange 104: the outer seal 110 and inner seal 112 together maintain the vacuum sealing despite the movement of the flange 104.

Figure 2:
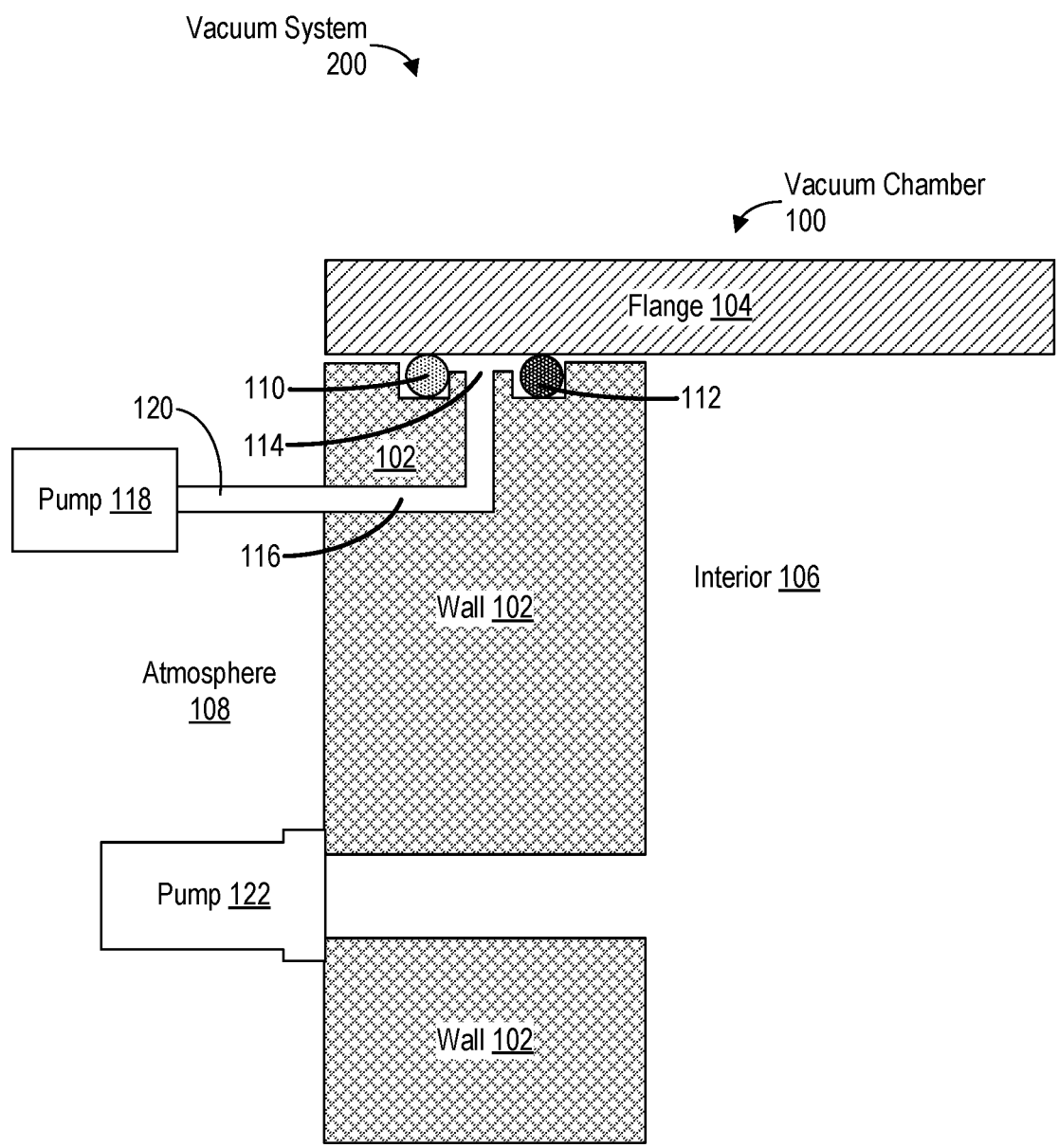
FIG. 2 is a cross-sectional view of a portion of a vacuum system that includes the vacuum chamber of FIG. 1, a first vacuum pump, and a second vacuum pump, in accordance with some embodiments.

FIG. 2 is a cross-sectional view of a portion of a vacuum system 200 that includes the vacuum chamber 100 (FIG. 1), a first vacuum pump 118, and a second vacuum pump 122, in accordance with some embodiments. The first vacuum pump 118 is coupled to the gap 114 through the path 116 and is used to evacuate the gap 114 and thus to provide a vacuum in the gap 114. For example, a tube 120 connects the first vacuum pump 118 to the path 116, thereby coupling the first vacuum pump 118 to the gap 114 through the path 116. (Equivalently, the tube 120 may be considered part of the path 116.) In some embodiments, the first vacuum pump 118 is a roughing pump that provides a rough vacuum in the gap 114.

The second vacuum pump 122 is used to provide a vacuum in the interior 106 of the vacuum chamber 100. The second vacuum pump 122 may provide this vacuum alone or in conjunction with one or more other vacuum pumps. A separate roughing pump (e.g., the first vacuum pump 118, through a connection with the interior 106 not shown in FIG. 2) may be initially used to pump the interior 106 down to a rough vacuum, after which the second vacuum pump 122 pumps the interior down to a higher vacuum (e.g., to UHV), either alone or in conjunction with the one or more other vacuum pumps. Example of the second vacuum pump 122 include, without limitation, a turbopump or a cryopump. In some embodiments, the second vacuum pump 122 is used to provide a higher (i.e., lower-pressure) vacuum in the interior 106 than the first vacuum pump 118 provides or is capable of providing in the gap 114. For example, the second vacuum pump 122 may be a UHV pump whereas the first vacuum pump 118 cannot provide an ultra-high vacuum in the gap 114 (e.g., the first vacuum pump 118 may be a roughing pump that provides a rough vacuum in the gap 114).

Figure 3:
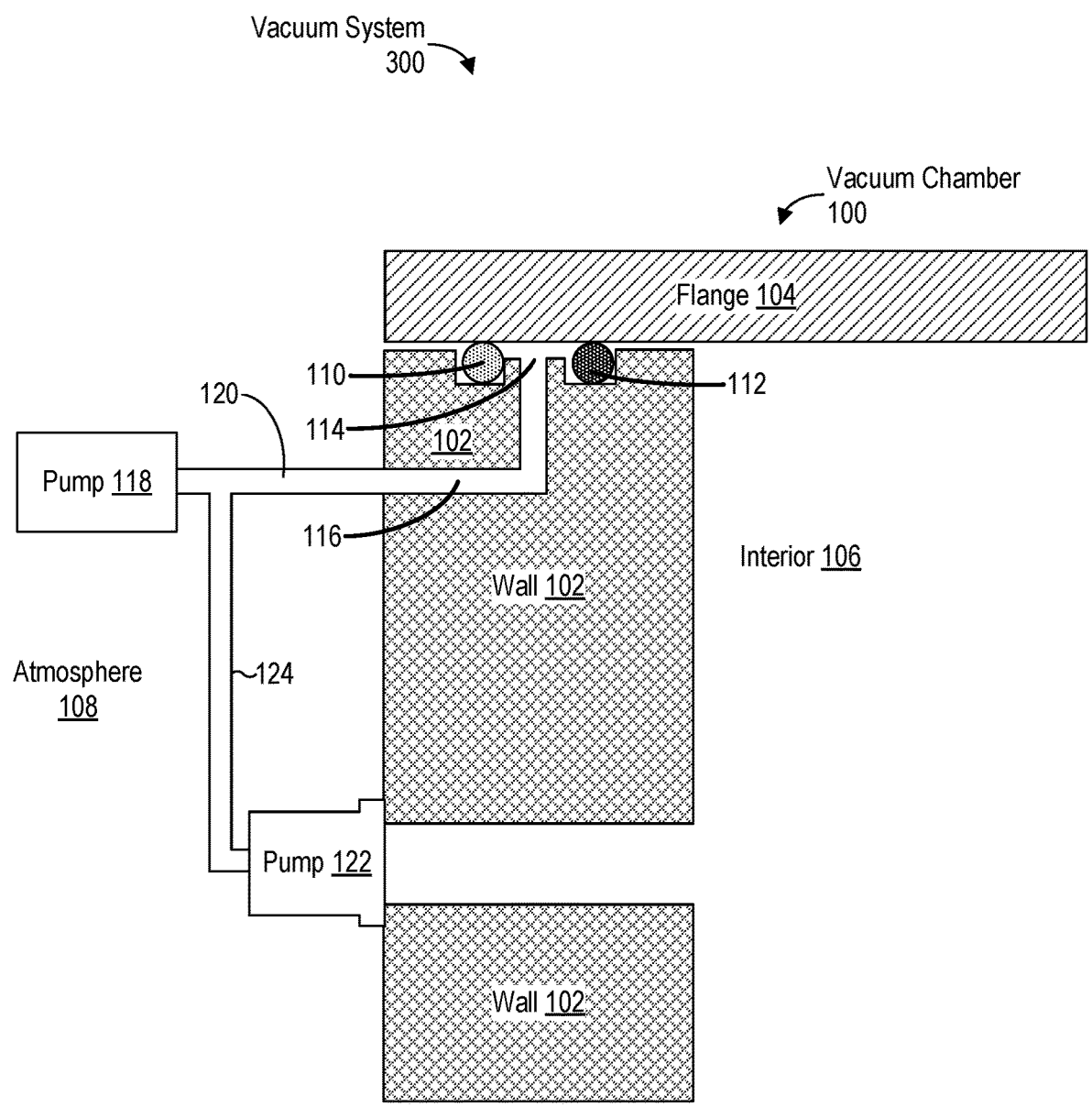
FIG. 3 is a cross-sectional view of a portion of a vacuum system that is an example of the vacuum system of FIG. 2, in accordance with some embodiments.

FIG. 3 is a cross-sectional view of a portion of a vacuum system 300 that is an example of the vacuum system 200 (FIG. 2) in accordance with some embodiments. In the vacuum system 300, the first vacuum pump 118 is coupled to the second vacuum pump 122 to exhaust the second vacuum pump 122. For example, a tube 124 couples the exhaust of the second vacuum pump 122 to the first vacuum pump 118. The tube 124 may connect with the tube 120.

A vacuum system (e.g., the vacuum system 200, FIG. 2, such as the vacuum system 300, FIG. 3) that includes the vacuum chamber 100 may be used in numerous different applications. In some embodiments, the vacuum chamber 100 is used in a metrology or inspection tool (e.g., a semiconductor metrology or inspection tool). For example, the vacuum chamber 100 may be used in a tool for inspecting reticles (i.e., photomasks) or semiconductor wafers for defects. The vacuum chamber 100 may contain optics in its interior 106; cleaning the interior 106 using a gas may include cleaning the optics. The optics may be extreme ultraviolet (EUV) optics (e.g., 13.5 nm optics). Numerous other examples are possible.

Figure 4:
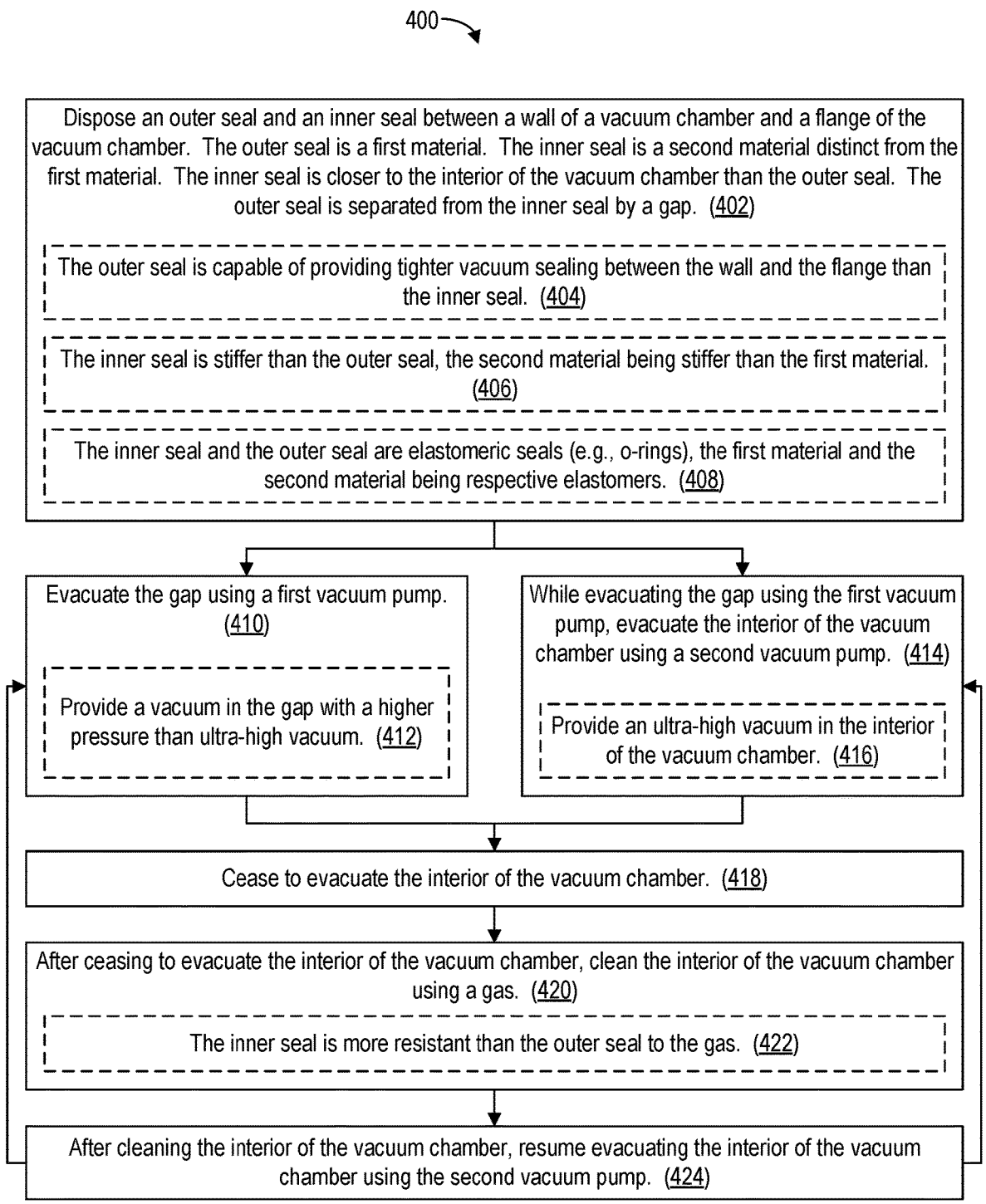
FIG. 4 is a flowchart illustrating a method of operating a vacuum system, in accordance with some embodiments.

FIG. 4 is a flowchart illustrating a method 400 of operating a vacuum system (e.g., the vacuum system 200, FIG. 2, such as the vacuum system 300, FIG. 3), in accordance with some embodiments. In the method 400, an outer seal (e.g., outer seal 110, FIGS. 1-3) and an inner seal (e.g., inner seal 112, FIGS. 1-3) are disposed (402) between a wall (e.g., wall 102, FIGS. 1-3) of a vacuum chamber (e.g., vacuum chamber 100, FIG. 103) and a flange (e.g., flange 104, FIGS. 1-3) of the vacuum chamber. The outer seal is a first material. The inner seal is a second material distinct from the first material. The inner seal and the outer seal are disposed such that the inner seal is closer to the interior of the vacuum chamber (e.g., interior 106, FIGS. 1-3) than the outer seal. The outer seal is separated from the inner seal by a gap (e.g., gap 114, FIGS. 1-3). In some embodiments, the outer seal is capable (404) of providing tighter vacuum sealing between the wall and the flange than the inner seal. In some embodiments, the inner seal is (406) stiffer than the outer seal, with the second material being stiffer than the first material. For example, the outer seal is capable of providing tighter vacuum sealing between the wall and the flange than the inner seal because it is less stiff than the inner seal and thus can form a better fit against the wall and the flange.

In some embodiments, the inner seal and the outer seal are (408) elastomeric seals (e.g., O-rings), with the first material and the second material being respective elastomers. The second material (i.e., the material of the inner elastomeric seal) may be stiffer than the first material (i.e., the material of the outer elastomeric seal), such that the inner elastomeric seal is stiffer than the outer elastomeric seal. For example, the first material is a fluoroelastomer and the second material is a perfluoroelastomer.

The gap is evacuated (410) using a first vacuum pump (e.g., first vacuum pump 118, FIGS. 2-3) (e.g., a turbopump or cryopump). The first vacuum pump thus provides a vacuum in the gap. While evacuating the gap using the first vacuum pump (i.e., while using the first vacuum pump to provide a vacuum in the gap), the interior of the vacuum chamber is evacuated (414) using a second vacuum pump (e.g., second vacuum pump 122, FIGS. 2-3). For example, an ultra-high vacuum is provided (416) in the interior of the vacuum chamber, while a vacuum with a higher pressure than ultra-high vacuum is provided (412) in the gap. The second vacuum pump may provide the vacuum in the interior of the vacuum chamber by itself or in conjunction with one or more other pumps (e.g., one or more other turbopumps or cryopumps).

The outer seal and the inner seal may be used to accommodate movement of the flange with respect to the wall while maintaining vacuum sealing between the wall and the flange. This movement occurs, for example, to allow self-alignment of the flange. This movement, and its accommodation by the outer and inner seals, occurs while evacuating the gap using the first vacuum pump and evacuating the interior of the vacuum chamber using the second vacuum pump. Alternatively, the flange is held static with respect to the wall while evacuating the gap using the first vacuum pump and evacuating the interior of the vacuum chamber using the second vacuum pump.

The vacuum chamber may need cleaning (e.g., periodic cleaning). The method 400 thus may further include ceasing to evacuate (418) the interior of the vacuum chamber. After ceasing to evacuate the interior of the vacuum chamber, the interior of the vacuum chamber is cleaned (420) using a gas (e.g., a reducing gas). In some embodiments, the gas is (or includes) ozone or atomic oxygen. The inner seal may be (422) more resistant than the outer seal to the gas. After cleaning the interior of the vacuum chamber, evacuation of the interior of the vacuum chamber using the second vacuum pump resumes (424), with performance of the method 400 returning to steps 410 and 414. Alternatively, performance of the method 400 returns to step 402 after step 424. The vacuum chamber thus may be cleaned repeatedly, with each cleaning being performed after a respective period of use.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A vacuum system, comprising:
   a wall of a vacuum chamber;
   a flange of the vacuum chamber;
   an outer seal disposed between the wall and the flange, the outer seal comprising a first material;
   an inner seal disposed between the wall and the flange, the inner seal comprising a second material distinct from the first material, wherein:
      the inner seal is closer to the interior of the vacuum chamber than the outer seal, the outer seal is separated from the inner seal by a gap, and the outer seal is capable of providing tighter vacuum sealing between the wall and the flange than the inner seal; and a path to couple the gap to a first vacuum pump, to evacuate the gap.

2. The vacuum system of claim 1, wherein the inner seal is more resistant than the outer seal to a gas to be used to clean the interior of the vacuum chamber.

3. The vacuum system of claim 2, wherein the gas comprises ozone.

4. The vacuum system of claim 2, wherein the gas comprises atomic oxygen.

5. The vacuum system of claim 1, wherein the inner seal is stiffer than the outer seal, the second material being stiffer than the first material.

6. The vacuum system of claim 1, wherein the inner seal and the outer seal are elastomeric seals, the first material and the second material being respective elastomers.

7. The vacuum system of claim 6, wherein the inner seal and the outer seal are O-rings.

8. The vacuum system of claim 6, wherein:
the first material is a fluoroelastomer; and
the second material is a perfluoroelastomer.

9. The vacuum system of claim 6, wherein the inner seal is stiffer than the outer seal, the second material being stiffer than the first material.

10. The vacuum system of claim 1, further comprising:
the first vacuum pump, coupled to the gap through the path; and
a second vacuum pump to provide an ultra-high vacuum in the interior of the vacuum chamber;
wherein the first vacuum pump is to provide a vacuum in the gap but is not capable of providing an ultra-high vacuum in the gap.

11. The vacuum system of claim 10, wherein the first vacuum pump is coupled to the second vacuum pump to exhaust the second vacuum pump.

12. The vacuum system of claim 1, wherein:
the flange is configured to move with respect to the wall during operation of the vacuum chamber; and
the outer seal and the inner seal are capable of accommodating movement of the flange with respect to the wall while collectively maintaining vacuum sealing between the wall and the flange.

13. The vacuum system of claim 1, wherein the flange is a door.

14. The vacuum system of claim 1, wherein at least one of the flange and the wall has a first groove to seat the outer seal and a second groove to seat the inner seal.

15. A method, comprising:
disposing an outer seal and an inner seal between a wall of a vacuum chamber and a flange of the vacuum chamber, wherein:
the outer seal comprises a first material,
the inner seal comprises a second material distinct from the first material,
the inner seal is closer to the interior of the vacuum chamber than the outer seal,
the outer seal is separated from the inner seal by a gap, and
the outer seal is capable of providing tighter vacuum sealing between the wall and the flange than the inner seal;
using a first vacuum pump, evacuating the gap; and while evacuating the gap using the first vacuum pump, evacuating the interior of the vacuum chamber using a second vacuum pump.

16. The method of claim 15, further comprising:
ceasing to evacuate the interior of the vacuum chamber;
after ceasing to evacuate the interior of the vacuum chamber, cleaning the interior of the vacuum chamber using a gas, wherein the inner seal is more resistant than the outer seal to the gas; and
after cleaning the interior of the vacuum chamber, resuming evacuating the interior of the vacuum chamber using the second vacuum pump.

17. The method of claim 16, wherein the gas comprises ozone or atomic oxygen.

18. The method of claim 15, wherein the inner seal is stiffer than the outer seal, the second material being stiffer than the first material.

19. The method of claim 15, wherein the inner seal and the outer seal are elastomeric seals, the first material and the second material being respective elastomers.

20. The method system of claim 19, wherein the inner seal and the outer seal are O-rings.

21. The method system of claim 19, wherein:
the first material is a fluoroelastomer; and
the second material is a perfluoroelastomer.

22. The method system of claim 19, wherein the inner seal is stiffer than the outer seal, the second material being stiffer than the first material.

23. The method of claim 15, wherein:
evacuating the interior of the vacuum chamber using the second vacuum pump comprises providing an ultra-high vacuum in the interior of the vacuum chamber; and
evacuating the gap using the first vacuum pump comprises providing a vacuum in the gap that has a higher pressure than ultra-high vacuum.

24. The method of claim 15, further comprising, while evacuating the gap using the first vacuum pump and evacuating the interior of the vacuum chamber using the second vacuum pump:
using the outer seal and the inner seal to accommodate movement of the flange with respect to the wall while maintaining vacuum sealing between the wall and the flange.

25. A vacuum system, comprising:
a wall of a vacuum chamber;
a flange of the vacuum chamber;
an outer seal disposed between the wall and the flange, the outer seal comprising a first material;
an inner seal disposed between the wall and the flange, the inner seal comprising a second material distinct from the first material, wherein:
the inner seal is closer to the interior of the vacuum chamber than the outer seal,
the outer seal is separated from the inner seal by a gap, and
the inner seal is more resistant than the outer seal to a gas to be used to clean the interior of the vacuum chamber; and
a path to couple the gap to a first vacuum pump, to evacuate the gap.

* * * * *